United States Patent
Numakura et al.

(10) Patent No.: US 8,382,910 B2
(45) Date of Patent: Feb. 26, 2013

(54) CLEANING METHOD FOR SUBSTRATE PROCESSING SYSTEM, STORAGE MEDIUM, AND SUBSTRATE PROCESSING SYSTEM

(75) Inventors: Masahiro Numakura, Nirasaki (JP);
Hiroaki Mochizuki, Nirasaki (JP);
Kiyohito Iijima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 665 days.

(21) Appl. No.: 12/398,587

(22) Filed: Mar. 5, 2009

(65) Prior Publication Data
US 2009/0229635 A1    Sep. 17, 2009

Related U.S. Application Data

(60) Provisional application No. 61/092,632, filed on Aug. 28, 2008.

(30) Foreign Application Priority Data

Mar. 17, 2008  (JP) .................................. 2008-067806

(51) Int. Cl.
*B08B 9/08* (2006.01)
(52) U.S. Cl. ......... 134/18; 134/22.1; 134/56 R; 438/905
(58) Field of Classification Search .................... 134/18, 134/22.1, 25.4; 438/905; 700/121
See application file for complete search history.

(56) References Cited

U.S. PATENT DOCUMENTS

| 6,911,398 B2* | 6/2005 | Narita et al. | 438/706 |
| 2001/0012971 A1* | 8/2001 | Nguyen | 700/121 |
| 2007/0215180 A1* | 9/2007 | Iijima | 134/18 |

FOREIGN PATENT DOCUMENTS
JP     8-176828    7/1996

\* cited by examiner

*Primary Examiner* — Michael Kornakov
*Assistant Examiner* — Natasha Campbell
(74) *Attorney, Agent, or Firm* — Oblon, Spivak, McClelland, Maier & Neustadt, L.L.P.

(57) ABSTRACT

A cleaning method for a substrate processing system capable of appropriately cleaning a housing chamber. In the substrate processing system, the number of execution times of product processing is accumulated, if the product processing to be executed next corresponds to first product processing for a subsequent lot, a time interval between preceding and subsequent lots is not longer than a predetermined time period, and a type of the last product processing performed for the preceding lot is the same as that of the first product processing to be performed for the subsequent lot. When the accumulated number of execution times is not less than a predetermined number of times, a cleaning treatment is executed, which corresponds to a chamber indicated in a system recipe set for a lot including a wafer on which the product processing is performed immediately before execution of the cleaning treatment.

9 Claims, 7 Drawing Sheets

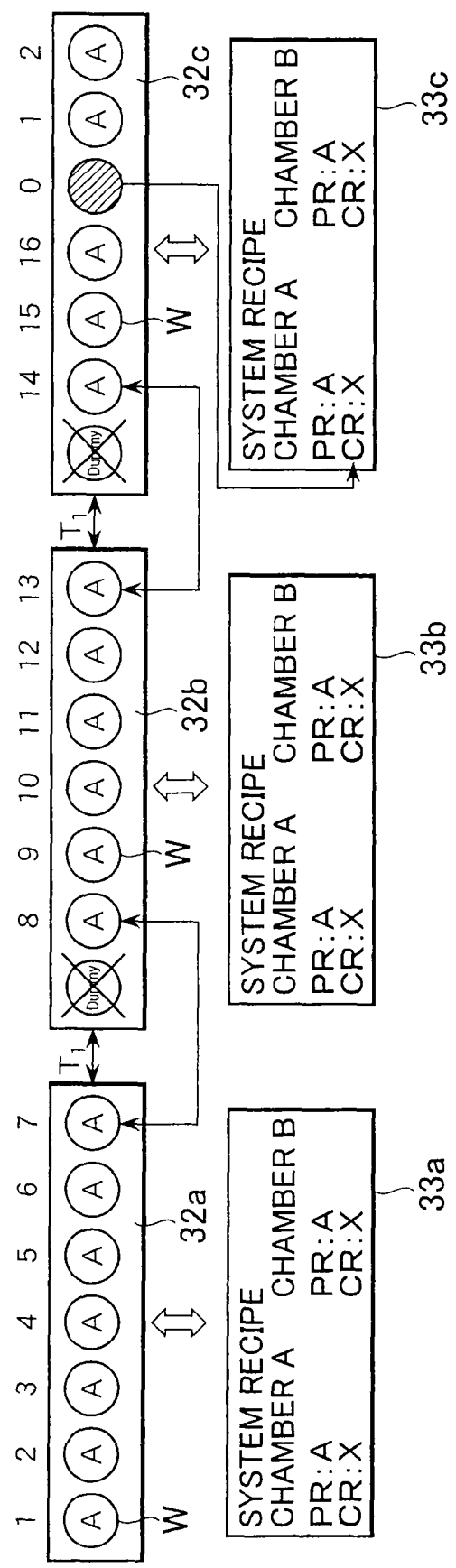

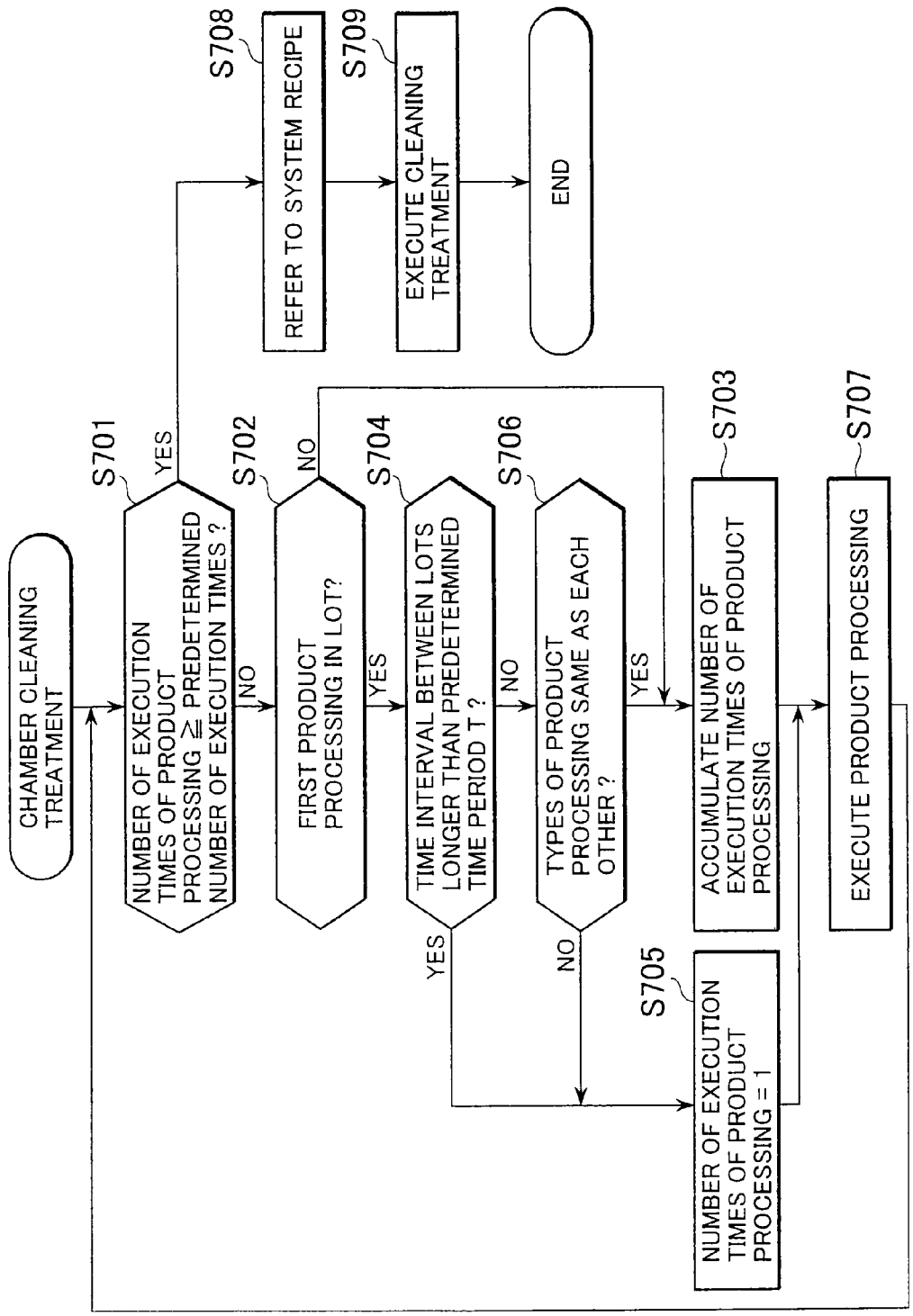

CLEANING METHOD FOR SUBSTRATE PROCESSING SYSTEM, STORAGE MEDIUM, AND SUBSTRATE PROCESSING SYSTEM

BACKGROUND OF THE INVENTION

1. Field of the Invention

The present invention relates to a cleaning method for a substrate processing system, a storage medium, and a substrate processing system. More particularly, the present invention relates to a method for cleaning a substrate processing system in which predetermined processing is performed in succession on substrates of a plurality of lots.

2. Description of the Related Art

A substrate processing system generally includes a chamber for housing a wafer as a substrate, generates plasma in the chamber, and performs plasma processing such as etching or CVD processing on the wafer. During the plasma processing performed in succession on wafers in the chamber, reaction products generated by the plasma processing and particles floating inside the chamber are adhered to surfaces of component parts disposed in the chamber. The substrate processing system thus regularly carries out an in-chamber cleaning treatment to clean the interior of the chamber.

In a known in-chamber cleaning treatment, a cleaning gas is introduced into the chamber, plasma is generated from the cleaning gas, and particles, etc. adhered to the interior of the chamber are etched by the plasma (see, for example, Japanese Laid-open Patent Publication No. 8-176828). During the plasma generation from the cleaning gas, a wafer remains housed in the chamber.

Usually in accordance with an operation program, a substrate processing system carries out plasma processing (hereinafter referred to as product processing) in succession on wafers in one lot, e.g., twenty-five wafers, for the fabrication of semiconductor devices or other products on the wafers. Since the substrate processing system ordinarily includes a plurality of chambers, e.g., two chambers, the product processing is carried out in each chamber on six to seven wafers per lot. Wafers in the same lot are subjected to the same product processing.

To enhance the efficiency of processing, there has been a demand that the product processing on wafers and the cleaning treatment be continuously carried out. To meet this demand, the present inventors et al. developed a first program for causing the substrate processing system to continuously carry out the product processing and the cleaning treatment for the wafers of one lot. With the first program, the cleaning treatment is performed at least once during the product processing on six to seven wafers in each chamber.

On the other hand, an amount of particles adhered to surfaces of component parts inside each chamber varies depending on contents of the product processing (type and pressure of processing gas, etc.). Therefore, the product processing on six to seven wafers assigned per lot to each chamber sometimes only results in a small amount of adherence of particles. In that case, it is unnecessary to carry out the cleaning treatment of the chamber. Nevertheless, with the first program, the cleaning treatment for the chamber is executed at least once per lot, causing a reduction in the efficiency of processing on wafers, i.e., a reduction in the efficiency of fabrication of semiconductor devices.

The present inventors et al. therefore developed a second program for performing the product processing in succession on wafers equal to or greater in number than wafers assigned per lot to each chamber, without making the cleaning treatment of the chamber. With the second program, the substrate processing system accumulatively counts, over different lots, the number of execution times of product processing in each chamber, and carries out the cleaning treatment of the chamber when the execution times of product processing exceeds a predetermined number of times. In the case of performing on wafers the product processing that only results in a small amount of adherence of particles, the cleaning treatment is carried out after successive execution of the product processing on a plurality of lots of wafers. As a result, each chamber can be cleaned in a timing in which an amount of adherence of particles reaches a given amount indicating that the cleaning treatment is to be performed.

With the second program, only one type of cleaning treatment can be set beforehand for each chamber, and the number of execution times of product processing is accumulatively counted irrespective of contents of the product processing performed on wafers of plural lots.

On the other hand, in processing wafers of a plurality of lots, the type of product processing is sometimes different between these lots. In that case, a problem is posed that the chamber cannot be satisfactorily cleaned, if the type of cleaning treatment set beforehand for the chamber is not suited to the product processing performed immediately before execution of the cleaning treatment. For example, this is the case if reaction products generated in the product processing are CF-based products, whereas the type of cleaning treatment set beforehand is suited for removal of resin deposits.

Even if the type of cleaning treatment set beforehand for each chamber is suited to the product processing performed immediately before execution of the cleaning treatment, the type of product processing performed on wafers of previous lot sometimes differs from that of product processing performed immediately before execution of cleaning treatment. In that case, until execution of the cleaning treatment, the product processing to which the type of cleaning treatment set beforehand is suited is executed a number of times less than a predetermined number of times. This poses a problem that the cleaning treatment is executed in an inappropriate condition (for example, in a state that an amount of adherence of particles is small).

SUMMARY OF THE INVENTION

The present invention provides a cleaning method for a substrate processing system, a storage medium, and a substrate processing system, which are capable of satisfactorily cleaning a housing chamber in an appropriate condition.

According to a first aspect of this invention, there is provided a cleaning method for a substrate processing system having a housing chamber in which a substrate is housed, the substrate processing system being adapted to perform predetermined processing in succession on substrates of a plurality of lots and carry out a cleaning treatment of the housing chamber, the cleaning method comprising a number-of-times setting step of setting beforehand a predetermined number of execution times corresponding to a timing in which the cleaning treatment is to be executed, a processing setting step of setting beforehand a type of the predetermined processing for each lot and a type of the cleaning treatment for each lot, which is suited to the predetermined processing, a type determining step of determining whether or not a type of the predetermined processing for a preceding lot is the same as a type of the predetermined processing for a subsequent lot of two successive lots, a number-of-times accumulating step of accumulating number of execution times of the predetermined processing in a case that the type of the predetermined processing for the preceding lot is the same as the type of the predetermined processing for the subsequent lot, and a cleaning step of executing, when the accumulated number of execution times of the predetermined processing reaches the predetermined number of execution times, the cleaning treatment of a type set for a lot including a substrate on which the predetermined processing is performed immediately before execution of the cleaning treatment.

With the cleaning method of this invention, the cleaning treatment of a type set for a lot including a substrate on which the predetermined processing is performed immediately before the execution of the cleaning treatment is executed. The executed cleaning treatment is suited to the predetermined processing since the type of predetermined processing and the type of cleaning treatment suited to the predetermined processing are set for each lot. As a result, the housing chamber can appropriately be cleaned. The number of execution times of the predetermined processing is accumulated when the type of predetermined processing for a preceding lot is the same as that of predetermined processing for a subsequent lot of two successive lots. When the accumulated number of execution times of the predetermined processing reaches a predetermined number of execution times, the cleaning treatment of a type set for a lot, including a substrate on which predetermined processing is performed immediately before the predetermined number of execution times is reached, is executed. Thus, the predetermined processing to which the cleaning treatment is suited is executed the predetermined execution times until execution of the cleaning treatment, and therefore the housing chamber can be cleaned in an appropriate condition.

In the number-of-times accumulating step, the number of execution times of predetermined processing can be accumulated only when a time interval between the preceding and subsequent lots is equal to or less than a predetermined time period.

With this cleaning method, the number of execution times of predetermined processing is accumulated only when the time interval between the preceding and subsequent lots is equal to or less than the predetermined time period. Therefore, a state inside the chamber does not change during the accumulation of the number of execution times of the predetermined processing. Thus, the housing chamber can be cleaned in a more appropriate condition.

In the type determining step, whether or not the type of the predetermined processing for the preceding lot is the same as the type of the predetermined processing for the subsequent lot can be determined based on a name of the predetermined processing for the preceding lot and a name of the predetermined processing for the subsequent lot.

With this cleaning method, whether or not the type of predetermined processing is the same between the preceding and subsequent lots is determined based on the names of predetermined processing for the preceding and subsequent lots, and therefore the determination can be easily and reliably carried out.

In the number-of-times accumulating step, the number of execution times of predetermined processing can be accumulated when the type of the predetermined processing for the preceding lot is the same as or similar to the type of the predetermined processing for the subsequent lot.

With this cleaning method, when the types of predetermined processing for preceding and subsequent lots are not the same as but similar to each other, the number of execution times of the predetermined processing is accumulated. A state inside the chamber does not substantially change when the types of predetermined processing are similar to each other. Thus, a condition for execution of the cleaning treatment can be relieved while maintaining an appropriate condition, whereby the frequency of cleaning the housing chamber can be decreased.

According to a second aspect of this invention, there is provided a computer-readable storage medium storing a program for causing a computer to execute the cleaning method according to the first aspect of this invention.

According to a third aspect of this invention, there is provided a substrate processing system having a control unit and a housing chamber in which a substrate is housed, the substrate processing system being adapted to perform predetermined processing in succession on substrates of a plurality of lots and carry out a cleaning treatment of the housing chamber, wherein the control unit is adapted to set beforehand a predetermined number of execution times corresponding to a timing in which the cleaning treatment is to be executed, set beforehand a type of the predetermined processing for each lot and a type of cleaning treatment for each lot, which is suited to the predetermined processing, determine whether or not a type of the predetermined processing for a preceding lot is the same as a type of the predetermined processing for a subsequent lot of two successive lots, accumulate the number of execution times of the predetermined processing in a case that the type of the predetermined processing for the preceding lot is the same as the type of the predetermined processing for the subsequent lot, and execute, when the accumulated number of execution times of the predetermined processing reaches the predetermined number of execution times, the cleaning treatment of a type set for a lot including a substrate on which the predetermined processing is performed immediately before execution of the cleaning treatment.

With the substrate processing system of this invention, the predetermined processing to which the cleaning treatment is suited is executed a predetermined number of execution times until execution of the cleaning treatment, and therefore the housing chamber can be cleaned in an appropriate condition.

Further features of the present invention will become apparent from the following description of an exemplary embodiment with reference to the attached drawings.

BRIEF DESCRIPTION OF THE DRAWINGS

FIG. 5 is a view for explaining an example setting of a chamber cleaning treatment performed in accordance with the number-of-wafers specifying cleaning counter inheritance function in FIGS. 4A to 4C;

FIG. 7 is a flowchart showing a chamber cleaning treatment as a cleaning method for the substrate processing system according to one embodiment.

DETAILED DESCRIPTION OF THE PREFERRED EMBODIMENT

The present invention will now be described in detail below with reference to the drawings showing a preferred embodiment thereof.

First, a substrate processing system according to one embodiment of this invention is described.

Figure 1:
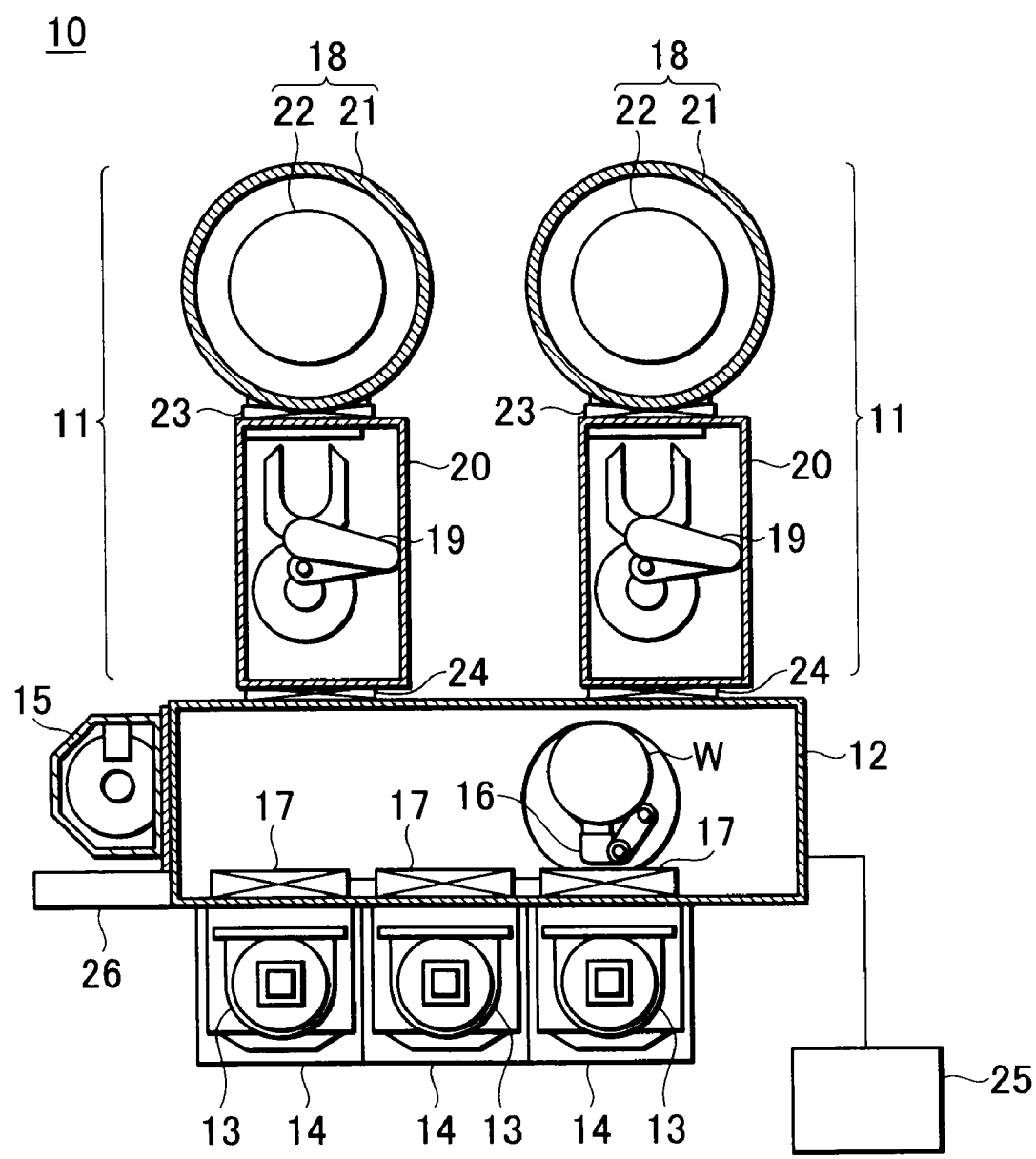
FIG. 1 is a plan view schematically showing the construction of a substrate processing system according to one embodiment of this invention.

FIG. 1 shows in plan view the construction of the substrate processing system according to one embodiment of this invention.

As shown in FIG. 1, the substrate processing system 10 includes two process ships 11 in each of which reactive ion etching (RIE) processing is performed in succession on semiconductor device wafers (hereinafter simply referred to as wafers) W, and includes a loader module 12 which is a rectangular common transfer chamber to which the two process ships 11 are connected.

In addition to the process ships 11, three FOUP mounting stages 14 are connected to the loader module 12. Each FOUP mounting stage 14 is mounted with a FOUP (front opening unified pod) 13, which is a container for housing twenty-five wafers W constituting one lot. Also connected to the loader module 12 is an orienter 15 that carries out pre-alignment of the position of a wafer W transferred out from one of the FOUPs 13.

The two process ships 11 are connected to a longitudinal side wall of the loader module 12 and disposed facing the three FOUP mounting stages 14 with the loader module 12 therebetween. The orienter 15 is disposed at one longitudinal end of the loader module 12.

The loader module 12 includes a SCARA-type dual arm transfer arm mechanism 16 disposed therein for transferring a wafer W, and includes three loading ports 17 as wafer entry ports disposed in a side wall of the loader module 12 so as to correspond to the FOUP mounting stages 14. The transfer arm mechanism 16 takes a wafer W out from one of the FOUPs on the FOUP mounting stages 14 through the corresponding loading port 17, and transfers the wafer W to one of the process ships 11 or to the orienter 15. The transfer arm mechanism 16 also transfers a wafer from the process ship 11 or the orienter 15 to the FOUP 13.

The process ships 11 each have a process module 18 for performing RIE processing in succession on wafers W and a load lock module 20 including a link-type single pick transfer arm 19 for transferring a wafer W into and out of the process module 18.

The process module 18 includes a cylindrical chamber 21 (housing chamber) in which one wafer W is housed and RIE processing is performed thereon, and includes a mounting stage 22 disposed inside the chamber 21. In the process module 18, a wafer W is mounted on the mounting stage 22, a processing gas, e.g., a mixture gas including $CF_4$ gas and argon gas, is introduced into the chamber 21, and an electric field is generated in the chamber 21. A plasma is produced from the introduced processing gas, and the RIE processing is performed on the wafer W by ions and radicals in the plasma.

The internal pressure of the loader module 12 is held at atmospheric pressure, whereas the internal pressure of the chamber 21 of the process module 18 is held at vacuum. Thus, a vacuum gate valve 23 is provided at a connecting part between the load lock module 20 and the process module 18, and an atmospheric gate valve 24 is provided at a connecting part between the load lock module 20 and the loader module 12.

Within the load lock module 20, the transfer arm 19 is disposed near the center of the module 20. The transfer arm 19 unloads a RIE processed wafer W from the chamber 21, and loads a wafer W to be subjected to the RIE processing into the chamber 21.

The substrate processing system 10 further includes a system controller 25 (control unit) for controlling operations of the process ships 11, the loader module 12 and the load lock modules 20 (hereinafter collectively referred to as the constituent parts), and includes an operation panel 26.

The system controller 25 includes a memory (not shown) for storing system recipes, described later, etc., includes a CPU (not shown) for carrying out the RIE processing in accordance with the system recipes, etc. and controls the operations of the constituent parts of the substrate processing system 10 in accordance with the system recipes, etc. The operation panel 26 includes a display unit comprised of, for example, an LCD (liquid crystal display), and displays thereon operations states of the constituent parts.

The memory of the system controller 25 stores, in addition to the system recipes, first to third cleaning method execution programs respectively corresponding to three functions, described below.

(In-lot Cleaning Function)

An in-lot cleaning function is to continuously carry out RIE processing (hereinafter referred to as the product processing (predetermined processing)) and a chamber cleaning treatment in each chamber 21 for wafers W of one lot. The cleaning treatment is to etch particles, etc., adhered to surfaces of component parts in the chamber 21 by using plasma generated from a cleaning gas.

Figure 2A:
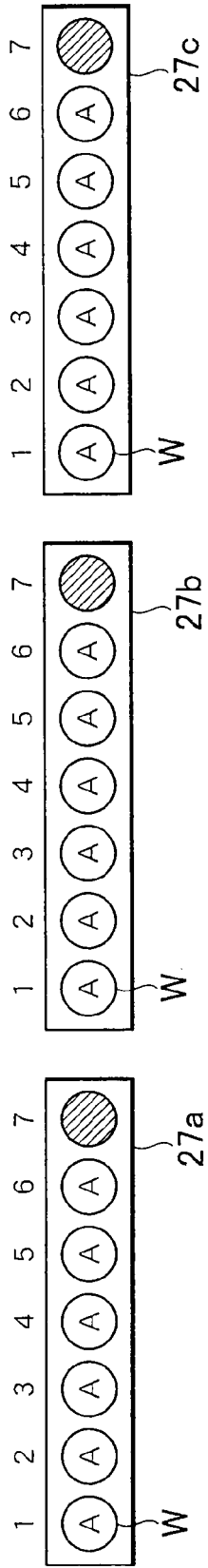
FIG. 2A is a view showing an example in-lot cleaning function of the substrate processing system shown in FIG. 1.

With the in-lot cleaning function, the cleaning treatment is carried out once without exception, while the product processing is performed in each chamber 21 on six to seven wafers W assigned per lot to each chamber 21. For example, as shown in FIG. 2A, product processing whose name is "A" is performed on the first to sixth wafers W of each of lots 27a, 27b and 27c, and the cleaning treatment is performed when the seventh wafer W (shown by hatching in FIG. 2A) is received in each chamber 21. With the in-lot cleaning function, the timing of execution of the cleaning treatment can be arbitrarily set to any timing in a time period for the processing for one lot of wafers. For example, the setting can be made such that the cleaning treatment is performed when the fourth wafer W is received in each chamber 21.

The in-lot cleaning function is realized by the CPU of the system controller 25 by controlling operations of the constituent parts of the substrate processing system 10 in accordance with the first cleaning method execution program.

(Process Module (PM) Usage Frequency-Based Cleaning Function)

A PM usage frequency-based cleaning function is to perform the product processing in succession on wafers W of a plurality of lots in each chamber 21.

Figure 2B:
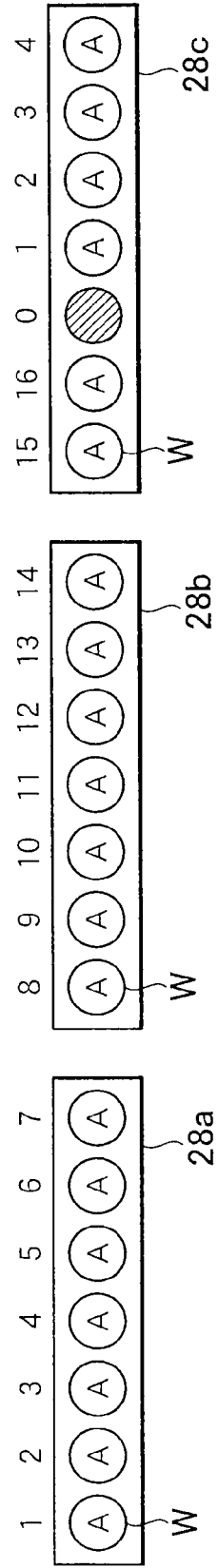
FIGS. 2B and 2C are views each showing an example of a PM usage frequency-based cleaning function of the substrate processing system.

For the PM usage frequency-based cleaning function, a predetermined number of execution times of product processing until execution of the cleaning treatment is set in advance. Then, the product processing is carried out in succession on wafers W of a plurality of lots in each chamber 21, and the number of execution times of product processing in each chamber 21 is accumulatively counted over different lots. For example, if the predetermined number of execution times of product processing is set to sixteen times, the product processing having name "A" is performed, as shown in FIG. 2B, on all of wafers W of lot 28a, all of wafers W of lot 28b, and the first and second wafers W of lot 28c. At that time, the number of execution times of product processing having name "A" is continuously accumulated in respect of lots 28a, 28b and 28c, as shown by numerals 1 to 16 in FIG. 2B. Numeral 0 represents, e.g., a dummy wafer for lot stabilizing dummy processing function, described later.

Immediately after the number of execution times of product processing having name "A" reaches sixteen times, the cleaning treatment is carried out when a wafer W is received in the chamber 21. With the PM usage frequency-based cleaning function, the predetermined number of execution times of product processing until execution of the cleaning treatment can arbitrarily be set.

Figure 2C:
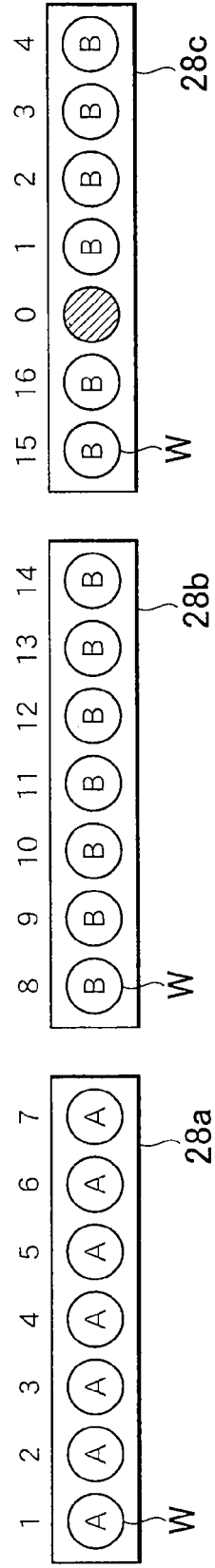

With the cleaning treatment based on the PM usage frequency-based cleaning function, only one type of cleaning treatment can be set in advance for each chamber 21. The one type of cleaning treatment set in advance is therefore executed irrespective of what type of product processing has been carried out until execution of the cleaning treatment. For example, as shown in FIG. 2C, in a case that the product processing having name "A" is performed on all of wafers W of lot 28a and product processing of type "B" is then performed on all of wafers W of lot 28b and the first and second wafers W of lot 28c, the number of execution times of product processing is accumulated irrespective of types of product processing. Immediately after the accumulated number of execution times of product processing reaches sixteen times, the cleaning treatment of the type set beforehand is carried out when a wafer W is received in the chamber 21.

The PM usage frequency-based cleaning function is realized by the CPU of the system controller 25 by controlling operations of the constituent parts of the substrate processing system 10 in accordance with the second cleaning method execution program.

(Number-of-Wafers Specifying Cleaning Counter Inheritance Function)

A number-of-wafers specifying cleaning counter inheritance function is to carry out product processing in succession on wafers W of a plurality of lots in each chamber 21 as with the PM usage frequency-based cleaning function. In addition, the timing of execution of the cleaning treatment is varied according to type of product processing on wafers W of each lot and time interval between preceding and subsequent lots of two successive lots.

For the cleaning counter inheritance function, a predetermined number of execution times of product processing until execution of cleaning treatment is set in advance. During the successive execution of product processing on wafers W of a plurality of lots in each chamber 21, the number of execution times of product processing is accumulated over different lots, if the following two conditions are satisfied.

The first condition is that a time interval between preceding and subsequent lots of two successive lots is equal to or less than a predetermined time period.

The second condition is that the type of the last product processing performed for the preceding lot is equal to the type of first product processing to be initially performed for the subsequent lot of the two successive lots.

To determine whether or not the first and second conditions for the cleaning counter inheritance function are currently satisfied, a lot stabilizing dummy processing function, described below, is utilized.

Figure 3A:
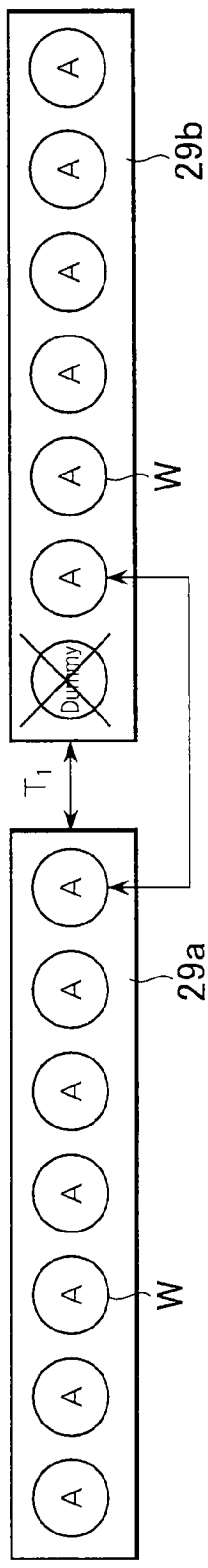
FIG. 3A to FIG. 3C are views each showing an example of a lot stabilizing dummy processing function of the substrate processing system in FIG. 1.
Figure 3B:
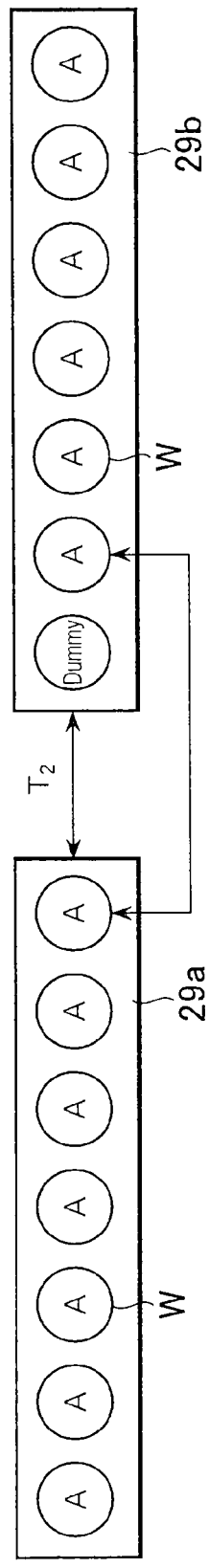
Figure 3C:
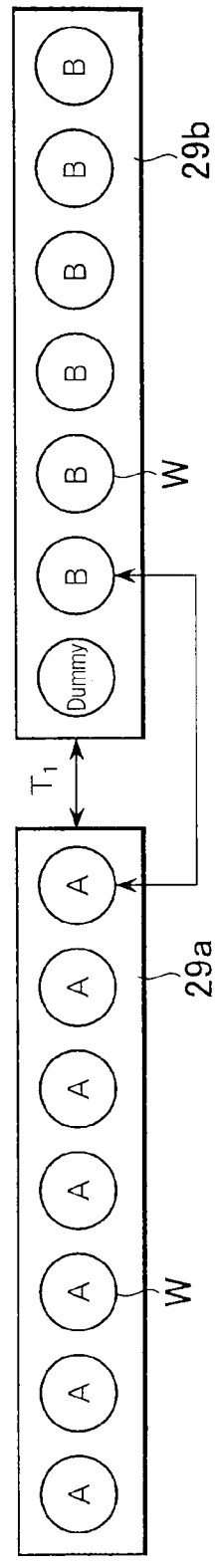

FIG. 3A to FIG. 3C illustrate the lot stabilizing dummy processing function.

Prior to execution of product processing on wafers W of a new lot, in order to attain and stabilize a state inside the chamber 21 suited to the product processing, a dummy wafer is usually set as a first wafer of the new lot and product processing for the new lot is performed on the dummy wafer (hereinafter referred to as the stabilizing processing). If the same product processing is performed on both the preceding lot and the new lot, it is unnecessary to change the state inside the chamber 21.

In the lot stabilizing dummy processing function, it is therefore determined whether or not a type of last product processing executed for the preceding lot is the same as a type of first product processing to be executed for the subsequent lot, if a dummy wafer is set as a first wafer in the subsequent lot of two successive lots. If both the types are the same as each other, the stabilizing processing using the dummy wafer as the first wafer in the subsequent lot is omitted. Specifically, whether or not the type of last product processing for the preceding lot is the same as the type of first product processing for the subsequent lot is determined based on a name of the last product processing executed for the preceding lot and a name of the first product processing to be executed for the subsequent lot.

As shown for example in FIG. 3A, if product processing having name "A" is performed on the last wafer in the preceding lot 29a and if product processing having name "A" is performed on a first wafer in the subsequent lot 29b, the names (A) of both the product processing are the same as each other. Thus, the stabilizing processing using a dummy wafer set as a first wafer in the subsequent lot 29b is omitted. On the other hand, the stabilizing processing using a dummy wafer is not omitted, if a name (A) of the last product processing performed for the preceding lot 29a differs from a name (B) of first product processing to be performed for the subsequent lot 29b as shown in FIG. 3C.

Even when the product processing for the subsequent lot is the same in type as the product processing for the preceding lot, there is a fear that a change occurs in the state inside the chamber 21, if a time interval between the two lots is long. With the lot stabilizing dummy processing function, therefore, if a time interval T2 between the preceding lot 29a and the subsequent lot 29b is longer than a predetermined time period T (FIG. 7), the stabilizing processing using a dummy wafer is not omitted, even when the name (A) of the last product processing performed for the preceding lot 29a is the same as the name (A) of the first product processing to be performed for the subsequent lot 29b as shown in FIG. 3B.

Specifically, the lot stabilizing dummy processing function includes a step of determining whether or not a time interval between preceding lot and subsequent lot of two successive lots is equal to or less than a predetermined time period, and a step of determining whether or not a type of first product processing to be performed for the subsequent lot of two successive lots is the same as a type of last product processing performed for the preceding lot of the two lots. These steps are utilized for the number-of-wafers specifying cleaning counter inheritance function.

Figure 4A:
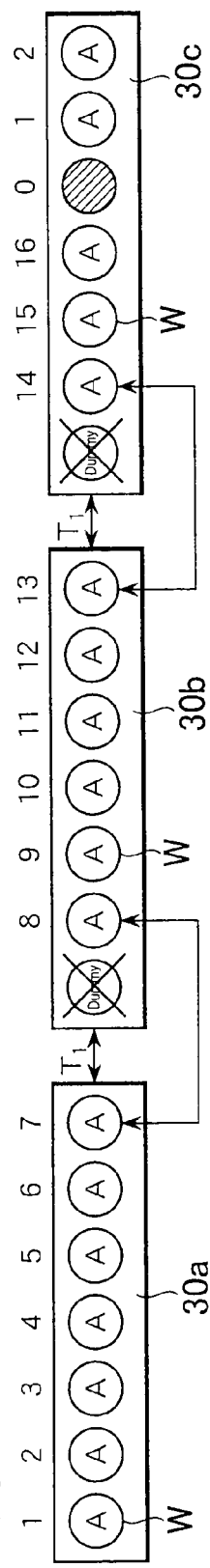
FIGS. 4A to 4C are views each showing an example of a number-of-wafers specifying cleaning counter inheritance function of the substrate processing system in FIG. 1.

In a case for example that the predetermined number of execution times of product processing until execution of cleaning treatment is set to sixteen times, according to the number-of-wafers specifying cleaning counter inheritance function, the number of execution times of product processing having name "A" in the chamber 21 is accumulated over lots 30a to 30c as shown by numerals 1 to 16 in FIG. 4A, if the name "A" of the last product processing performed for the preceding lot (30a or 30b) of three successive lots 30a, 30b and 30c is the same as the name "A" of first product processing to be performed for the subsequent lot (30b or 30c) of the lots 30a, 30b and 30c as shown in FIG. 4A and if a time interval T1 between the preceding lot (30a or 30b) and the subsequent lot (30b or 30c) is equal to or less than a predetermined time period T. In that case, stabilizing processing using a dummy wafer as a first wafer in the subsequent lot (30b or 30c) is omitted.

Immediately after the number of execution times of product processing having name "A" reaches sixteen times, the cleaning treatment is carried out when a wafer W is received in the chamber 21. For the number-of-wafers specifying cleaning counter inheritance function, it is possible to arbitrary set the predetermined number of execution times of product processing until execution of the cleaning treatment.

Figure 4B:
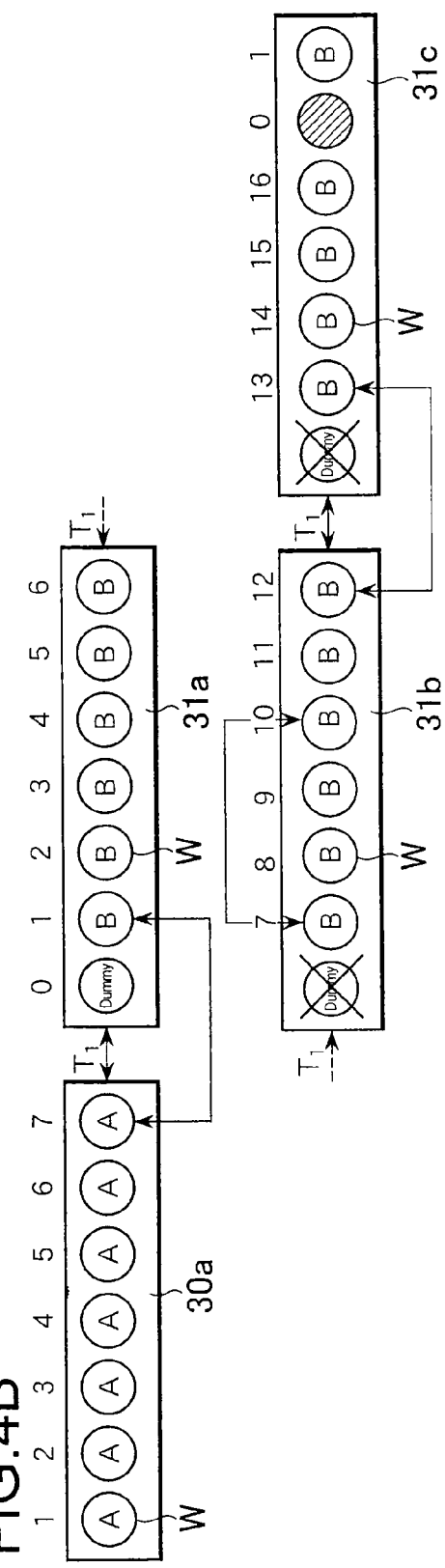

With the number-of-wafers specifying cleaning counter inheritance function, in a case as shown for example in FIG. 4B that the name "A" of the last product processing performed for the preceding lot 30a differs from the name "B" of the first product processing to be preformed for the subsequent lot 31a of two successive lots 30a, 31a, the number of execution times of product processing in the chamber 21 is not accumulated over the preceding and subsequent lots 30a, 31a, but is restarted from a value of "1" at the subsequent lot 31a, as shown by numerals 1 to 7 and 0 to 6 in FIG. 4B. Subsequently, if the name of product processing remains the same, "B", for three successive lots 31a, 31b and 31c and if a time interval T1 between two successive lots is equal to or less than the predetermined time period T, the number of execution times of product processing having name "B" in the chamber 21 is accumulated as shown by numerals 1 to 16 in FIG. 4B.

Figure 4C:
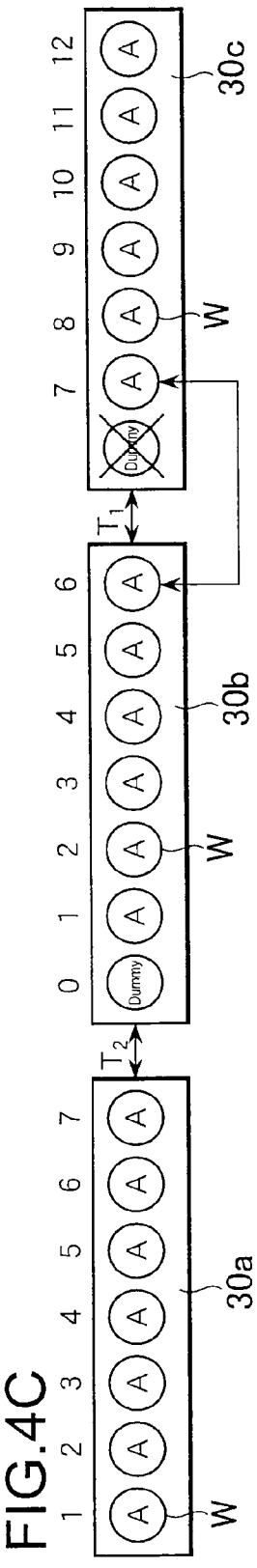

With the number-of-wafers specifying cleaning counter inheritance function, if, for example, a time interval T2 between the preceding and subsequent lots 30a, 30b of two successive lots 30a, 30b is longer than the predetermined time, the number of execution times of product processing in the chamber 21 is not accumulated over the preceding and subsequent lots 30a, 30b but is restarted from "1" at the subsequent lot 30b, as shown by numerals 1 to 7 and 0 to 6 in FIG. 4C With the PM usage frequency-based cleaning function, one type of cleaning treatment set beforehand for the chamber 21 is executed irrespective of the type of product processing carried out before the cleaning treatment. Therefore, if the type of cleaning treatment set beforehand is not suited to the product processing executed in the chamber 21, the chamber 21 cannot be cleaned satisfactorily. On the other hand, with the number-of-wafers specifying cleaning counter inheritance function, the type of cleaning treatment of the chamber 21 is set on a per lot basis. To this end, system recipes are set in each of which there are indicated a type (name) of product processing and a type (name) of cleaning treatment that are to be performed for each lot in each chamber. The system recipes are stored in a memory of the system controller 25. In this embodiment, cleaning treatment indicated in a system recipe for a chamber 21 is also suited to another chamber 21 indicated in the same system recipe.

Figure 6:
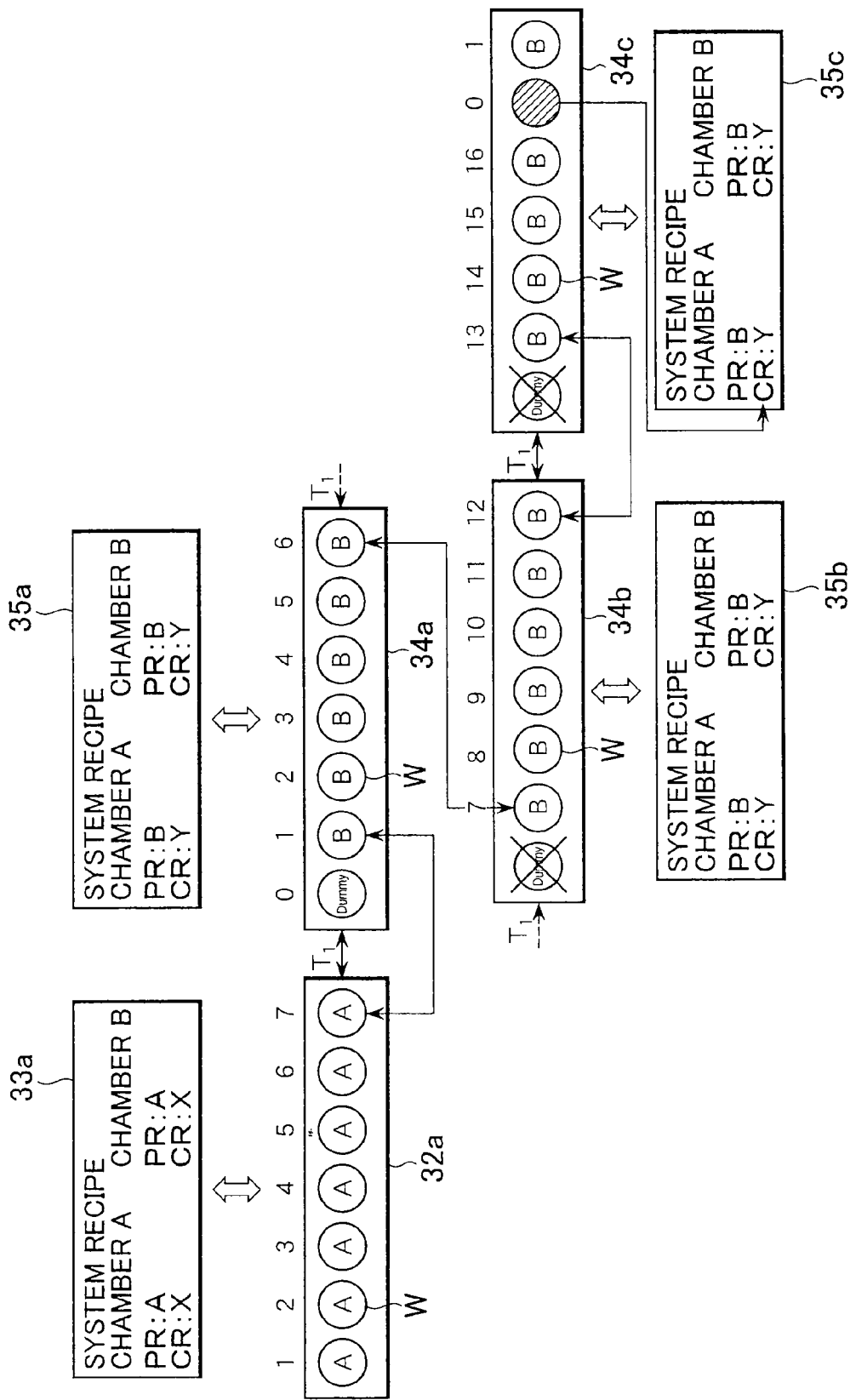
FIG. 6 is a view for explaining an example setting of a chamber cleaning treatment performed in accordance with the number-of-wafers specifying cleaning counter inheritance function in FIGS. 4A to 4C.

FIGS. 5 and 6 explain how the setting of cleaning treatment of the chamber for each lot is made for use in the number-of-wafers specifying cleaning counter inheritance function. In the following, it is assumed that cleaning treatment having name "X" is suited to product processing having name "A", whereas the cleaning treatment having name "Y" is suited to product processing having name "B".

As shown in FIG. 5, system recipes 33a to 33c are set for three successive lots 32a to 32c. In each of the system recipes 33a to 33c, the type (name) (PR in FIG. 5) of product processing to be performed for each lot in each of the chambers 21 of the substrate processing system 10 (chambers A, B in FIG. 5) is set to "A", and the type (name) (CR in FIG. 5) of cleaning treatment for each lot is set to "X". The predetermined number of execution times of product processing until execution of cleaning treatment is set to sixteen times. In that case, the cleaning treatment is carried out in accordance with the system recipes 33a to 33c when a wafer W is received in the chamber A immediately after the number of execution times of product processing having the name "A" reaches sixteen times. At that time, the system recipe 33c is referred to, which is set for the lot 32c including a wafer W on which the product processing having name "A" is performed immediately before execution of the cleaning treatment (wafer W subjected to sixteenth product processing having name "A"), and the cleaning treatment having name "X" corresponding to the chamber A indicated in the system recipe 33c is carried out.

Referring to FIG. 6, system recipes 33a and 35a to 35c are set for four successive lots 32a and 34a to 34c. In the system recipe 33a, the type (name) of product processing to be performed for each lot in each of the chambers 21 of the substrate processing system 10 is set to "A", and the type (name) of the cleaning treatment for each lot is set to "X". In each of the system recipe 35a to 35c, the type (name) of the product processing to be performed for each lot in each of the chambers 21 of the substrate processing system 10 is set to "B", and the type (name) of the cleaning treatment for each lot is set to "Y". The predetermined the number of execution times of product processing until execution of cleaning treatment is set to sixteen times. In that case, cleaning treatment is carried out when a wafer W is received in the chamber A immediately after the number of execution times of product processing having name "B" reaches sixteen times. At that time, the system recipe 35c is referred to, which is set for the lot 34c including a wafer W on which the product processing having name "B" is performed immediately before execution of the cleaning treatment (wafer W subjected to sixteenth product processing having name "B"), and the cleaning treatment having name "Y" corresponding to the chamber A indicated in the system recipe 35c is carried out.

The number-of-wafers specifying cleaning counter inheritance function is realized by the CPU of the system controller 25 by controlling operations of the constituent parts of the substrate processing system 10 in accordance with the third cleaning method execution program.

Next, a description is given of a chamber cleaning treatment as a cleaning method for the substrate processing system of this embodiment.

FIG. 7 shows in flowchart the chamber cleaning treatment as a cleaning method for the substrate processing system of this embodiment. The chamber cleaning treatment is carried out by the CPU of the system controller 25 in accordance with the third cleaning method execution program. Before execution of the chamber cleaning treatment, a predetermined number of execution times of product processing, which corresponds to the timing of execution of cleaning treatment, is set beforehand (number-of-times setting step) and system recipes for respective lots are set (processing setting step).

Referring to FIG. 7, it is first determined whether or not an accumulated number of execution times of product processing is equal to or larger than the predetermined number of execution times of product processing (step S701). If the accumulated number of execution times of product processing is less than the predetermined number of execution times of product processing, whether or not product processing to be executed next corresponds to first product processing to be initially executed in a given lot is determined (step S702).

If the product processing to be executed next does not correspond to the first product processing (NO to step S702), the number of execution times of product processing is incremented by "1" (step S703) to accumulate the number of execution times (number-of-times accumulating step).

On the other hand, if it is determined in step S702 that the product processing to be carried out next corresponds to the first product processing to be initially executed in the lot (YES to step S702), whether or not a time interval between the lot including a wafer W on which the next product processing is to be made (hereinafter referred to as the subsequent lot) and the preceding lot is longer than a predetermined time period T (step S704). If the time interval is longer than the predetermined time period T (YES to step S704), the number of execution times of product processing is reset to "1" (step S705).

If it is determined in step S704 that the time interval is equal to or less than the predetermined time period T, system recipes set for the lots are referred to, and the name of the last product processing executed for the preceding lot is compared with the name of the first product processing to be executed for the subsequent lot, thereby determining whether or not the type of the last product processing executed for the preceding lot is the same as the type of the first product processing to be executed for the subsequent lot (step S706) (type determining step).

If it is determined in step S706 that the types of these product processing are the same as each other (YES to step S706), the number of execution times of product processing is incremented by "1" (step S703) to accumulate the number of execution times (number-of-times accumulating step). On the other hand, if the types of both product processing are different from each other (NO to step S706), the number of execution times of product processing is reset to "1" (step S705).

Next, referring to the system recipe set for the subsequent lot, the product processing corresponding to the chamber 21 indicated in the system recipe is executed (step S707), and the flow returns to step S701.

If it is determined in step S701 that the accumulated number of execution times of product processing is equal to or greater than the predetermined number of execution times of product processing, the system recipe is referred to, which is set for the lot including a wafer W on which the product processing is performed immediately before the determination (step S708), and the cleaning treatment corresponding to the chamber 21 indicated in the system recipe is executed (step S709), whereupon the process is completed.

With the cleaning treatment in FIG. 7, the system recipe is referred to, which is set for the lot containing the wafer W on which the product processing is performed immediately before execution of cleaning treatment, and the cleaning treatment corresponding to the chamber 21 indicated in the system recipe is executed. Since the system recipes are each set with the type of product processing for the corresponding lot and the type of cleaning treatment suited to the product processing, the thus executed cleaning treatment is suited to the product processing executed immediately before execution of the cleaning treatment. As a result, the chamber 21 can be satisfactorily cleaned.

In the cleaning treatment in FIG. 7, the number of execution times of product processing is incremented by "1" to accumulate the number of execution times, if a time interval between preceding and subsequent lots of two successive lots is equal to or less than a predetermined time period and if the type of product processing for the preceding lot is the same as the type of product processing for the subsequent lot. Furthermore, if the accumulated number of execution times of product processing becomes equal to or greater than a predetermined number of execution times of product processing, a system recipe set for the lot including a wafer W on which product processing is performed immediately before execution of cleaning treatment is referred to, and the cleaning treatment corresponding to the chamber 21 indicated in the system recipe is executed. Thus, the product processing to which the cleaning treatment is suited is executed the predetermined number of execution times until execution of the cleaning treatment, and therefore the chamber 21 can be cleaned in an appropriated condition. In addition, a change hardly occurs in the state inside the chamber 21 during the accumulation of the number of execution times of product processing. As a result, a state suited to the cleaning treatment can be achieved inside the chamber 21 by executing the product processing, and the chamber 21 can be cleaned in the just-mentioned state, i.e., in a more appropriate condition.

With the cleaning treatment in FIG. 7, whether or not the type of product processing for the preceding lot is the same as that of product processing for the subsequent lot is determined based on the name of product processing for the preceding lot and that of product processing for the subsequent lot. The determination can therefore be easily and reliably made, without actually confirming the state inside the chamber 21.

In the cleaning treatment in FIG. 7, the number of execution times of product processing is accumulatively counted, only if the type of product processing for the preceding lot is the same as that of product processing for the subsequent lot. However, the number of execution times of product processing may be accumulated, if the type of product processing for the preceding lot is similar to that of product processing for the subsequent lot, i.e., if the content of product processing for the preceding lot is not the same as but similar to that of product processing for the subsequent lot. The state inside the chamber does not substantially change, if the content of product processing for the preceding lot is similar to that of product processing for the subsequent lot. In that case, even if the number of execution times of product processing is accumulated and the cleaning treatment is executed, the chamber 21 can be cleaned in an appropriate condition. As a result, the condition required for execution of the cleaning treatment of the chamber can be relieved while maintaining an appropriate condition, whereby the frequency of cleaning the chamber 21 can be reduced.

In the cleaning treatment in FIG. 7, after execution of the cleaning treatment, seasoning processing may be performed to achieve and stabilize, inside the chamber, a state suited to new product processing, whereby the state inside the chamber 21 can rapidly be stabilized. At that time, whether or not the types of product processing before and after execution of cleaning treatment are the same as each other may be determined by using a step in the lot stabilizing dummy processing function to determine whether types of product processing are the same as each other. The seasoning processing can be omitted, if the types of product processing are the same as each other.

In the embodiment, the product processing performed on wafers W is RIE processing. However, the product processing may be plasma processing or other processing not using plasma but generating reaction products or particles in chambers 21.

In the above described embodiment, substrates to be etched are semiconductor wafers W. However, substrates to be etched are not limited thereto, but may be, for example, glass substrates for LCDs (liquid crystal displays) or FPDs (flat panel displays).

It is to be understood that the present invention may also be accomplished by supplying a computer (for example, the system controller 25) with a storage medium in which a program code of software, which realizes the functions of the above described embodiment is stored and by causing the computer to read out and execute the program code stored in the storage medium.

In that case, the program code itself read from the storage medium realizes the functions of the above described embodiment, and therefore the program code and the storage medium in which the program code is stored constitute the present invention.

Examples of the storage medium for supplying the program code include a RAM, an NV-RAM, a floppy (registered trademark) disk, a hard disk, a magnetic-optical disk, an optical disk such as a CD-ROM, a CD-R, a CD-RW, a DVD (DVD-ROM, DVD-RAM, DVD-RW, DVD+RW), a magnetic tape, a nonvolatile memory card, and a ROM. Alternatively, the program code may be supplied to the computer by being downloaded from another computer, a database, or the like, not shown, connected to the Internet, a commercial network, a local area network, or the like.

Further, it is to be understood that the functions of the above described embodiment may be accomplished not only by executing the program code read out by a computer, but also by causing an OS (operating system) or the like which operates on the computer to perform a part or all of the actual operations based on instructions of the program code.

Further, it is to be understood that the functions of the above described embodiment may be accomplished by writing a program code read out from the storage medium into a memory provided on an expansion board inserted into a computer or a memory provided in an expansion unit connected to the computer and then causing a CPU or the like provided in the expansion board or the expansion unit to perform a part or all of the actual operations based on instructions of the program code.

The form of the program code may be an object code, a program code executed by an interpreter, script data supplied to an OS, or the like.

What is claimed is:

1. A cleaning method for a substrate processing system having a housing chamber in which a substrate is housed, the substrate processing system being adapted to perform predetermined processing in succession on substrates of a plurality of lots and carry out a cleaning treatment of the housing chamber, the cleaning method comprising:

a number-of-times setting step of setting beforehand a predetermined number of execution times of the predetermined processing corresponding to a timing in which the cleaning treatment is to be executed;

a processing setting step of setting beforehand a type of the predetermined processing for each lot and a type of the cleaning treatment for each lot, which is suited to the predetermined processing;

a type determining step of determining whether or not a type of the predetermined processing for a preceding lot is the same as a type of the predetermined processing for a subsequent lot of two successive lots;

a number-of-times accumulating step of accumulating number of execution times of the predetermined processing in a case that the type of the predetermined processing for the preceding lot is the same as the type of the predetermined processing for the subsequent lot; and a cleaning step of executing, when the accumulated number of execution times of the predetermined processing reaches the predetermined number of execution times, the cleaning treatment of a type set for a lot including a substrate on which the predetermined processing is performed immediately before execution of the cleaning treatment, wherein each of the plurality of lots includes a plurality of substrates subjected to the predetermined processing, and wherein in said cleaning step, when the substrate subjected to the predetermined processing corresponding to the predetermined number of execution times set beforehand is not a last substrate for a lot including the substrate, the cleaning treatment of the type set for the lot including the substrate is performed before completion of the predetermined processing on all the substrates included in the lot.

2. The cleaning method according to claim 1, wherein in said number-of-times accumulating step, the number of execution times of the predetermined processing is accumulated only when a time interval between the preceding and subsequent lots is equal to or less than a predetermined time period.

3. The cleaning method according to claim 1, wherein in said type determining step, whether or not the type of the predetermined processing for the preceding lot is the same as the type of the predetermined processing for the subsequent lot is determined based on a name of the predetermined processing for the preceding lot and a name of the predetermined processing for the subsequent lot.

4. The cleaning method according to claim 1, wherein in said number-of-times accumulating step, the number of execution times of predetermined processing is accumulated when the type of the predetermined processing for the preceding lot is the same as or similar to the type of the predetermined processing for the subsequent lot.

5. A computer-readable storage medium storing a program for causing a computer to execute a cleaning method for a substrate processing system having a housing chamber in which a substrate is housed, the substrate processing system being adapted to perform predetermined processing in succession on substrates of a plurality of lots and carry out a cleaning treatment of the housing chamber, the cleaning method comprising:

a number-of-times setting step of setting beforehand a predetermined number of execution times of the predetermined processing corresponding to a timing in which the cleaning treatment is to be executed;

a processing setting step of setting beforehand a type of the predetermined processing for each lot and a type of cleaning treatment for each lot, which is suited to the predetermined processing;

a type determining step of determining whether or not a type of the predetermined processing for a preceding lot is the same as a type of the predetermined processing for a subsequent lot of two successive lots;

a number-of-times accumulating step of accumulating number of execution times of the predetermined processing in a case that the type of the predetermined processing for the preceding lot is the same as the type of the predetermined processing for the subsequent lot; and a cleaning step of executing, when the accumulated number of execution times of the predetermined processing reaches the predetermined number of execution times, the cleaning treatment of a type set for a lot including a substrate on which the predetermined processing is performed immediately before execution of the cleaning treatment, wherein each of the plurality of lots includes a plurality of substrates subjected to the predetermined processing, and wherein in said cleaning step, when the substrate subjected to the predetermined processing corresponding to the predetermined number of execution times set beforehand is not a last substrate for a lot including the substrate, the cleaning treatment of the type set for the lot including the substrate is performed before completion of the predetermined processing on all the substrates included in the lot.

6. A substrate processing system having a control unit and a housing chamber in which a substrates is housed, the substrate processing system being adapted to perform predetermined processing in succession on substrates of a plurality of lots and carry out a cleaning treatment of the housing chamber, wherein the control unit is adapted to:

set beforehand a predetermined number of execution times of the predetermined processing corresponding to a timing in which the cleaning treatment is to be executed;

set beforehand a type of the predetermined processing for each lot and a type of cleaning treatment for each lot, which is suited to the predetermined processing;

determine whether or not a type of the predetermined processing for a preceding lot is the same as a type of the predetermined processing for a subsequent lot of two successive lots;

accumulate number of execution times of the predetermined processing in a case that the type of the predetermined processing for the preceding lot is the same as the type of the predetermined processing for the subsequent lot;

execute, when the accumulated number of execution times of the predetermined processing reaches the predetermined number of execution times, the cleaning treatment of a type set for a lot including a substrate on which the predetermined processing is performed immediately before execution of the cleaning treatment; and each of the plurality of lots includes a plurality of substrates subjected to the predetermined processing, and in executing the cleaning treatment, when the substrate subjected to the predetermined processing corresponding to the predetermined number of execution times set beforehand is not a last substrate for a lot including the substrate, the control unit executes the cleaning treatment of the type set for the lot including the substrate before completion of the predetermined processing on all the substrates included in the lot.

7. The cleaning method according to claim 1, wherein in said number-of-times accumulating step, number of execution times of the predetermined processing is accumulated if the type of the predetermined processing executed last in the preceding lot is the same as the type of the predetermined processing executed first in the subsequent lot.

8. The computer-readable storage medium according to claim 5, wherein in said number-of-times accumulating step, number of execution times of the predetermined processing is accumulated if the type of the predetermined processing executed last in the preceding lot is the same as the type of the predetermined processing executed first in the subsequent lot.

9. The substrate processing system according to claim 6, wherein number of execution times of the predetermined processing is accumulated if the type of the predetermined processing executed last in the preceding lot is the same as the type of the predetermined processing executed first in the subsequent lot.

* * * * *